US010084100B2

(12) United States Patent
Nakamura et al.

(10) Patent No.: US 10,084,100 B2
(45) Date of Patent: Sep. 25, 2018

(54) SOLAR CELL ELEMENT AND METHOD FOR MANUFACTURING SAME

(75) Inventors: Masami Nakamura, Ome (JP); Naoto Shindo, Ome (JP); Tadashi Kanasaku, Ome (JP); Junichi Atobe, Yasu (JP)

(73) Assignees: SHOEI CHEMICAL INC., Shinjuku-ku, Tokyo (JP); KYOCERA CORPORATION, Kyoto-shi, Kyoto (JP)

( * ) Notice: Subject to any disclaimer, the term of this patent is extended or adjusted under 35 U.S.C. 154(b) by 20 days.

(21) Appl. No.: 13/821,821

(22) PCT Filed: Oct. 4, 2011

(86) PCT No.: PCT/JP2011/072841
§ 371 (c)(1),
(2), (4) Date: Mar. 8, 2013

(87) PCT Pub. No.: WO2012/046719
PCT Pub. Date: Apr. 12, 2012

(65) Prior Publication Data
US 2013/0167923 A1 Jul. 4, 2013

(30) Foreign Application Priority Data

Oct. 7, 2010 (JP) .................................. 2010-227448

(51) Int. Cl.
*H01L 31/00* (2006.01)
*H01L 31/0224* (2006.01)
(Continued)

(52) U.S. Cl.
CPC ....... *H01L 31/022425* (2013.01); *H01B 1/22* (2013.01); *H01L 29/0657* (2013.01);
(Continued)

(58) Field of Classification Search
CPC .................. H01L 31/022425; H01L 31/02363
(Continued)

(56) References Cited

U.S. PATENT DOCUMENTS 5,188,990 A * 2/1993 Dumesnil et al. ............... 501/19
8,551,368 B2 * 10/2013 Nakamura et al. ........... 252/514
(Continued)

FOREIGN PATENT DOCUMENTS

CN 101395723 A 3/2009
CN 101503277 A 8/2009
(Continued)

OTHER PUBLICATIONS

English machine translation of JP 10029834 A.*
(Continued)

*Primary Examiner* — Angelo Trivisonno
(74) *Attorney, Agent, or Firm* — Flynn Thiel, P.C.

(57) ABSTRACT

A solar cell element containing: a semiconductor substrate; an antireflection film disposed in a first region on one main surface of the semiconductor substrate; and a front surface electrode disposed in a second region on the one main surface of the semiconductor substrate and containing silver as a main component and a tellurium-based glass containing tellurium, tungsten, and bismuth. The solar cell element is manufactured by forming the antireflection film on the one main substrate surface; printing on the antireflection film a conductive paste containing a conductive powder mainly containing silver, a tellurium-based glass frit containing tellurium, tungsten, and bismuth, and an organic vehicle; and disposing the antireflection film in the first region and forming the front surface electrode in the second region, by firing the paste and eliminating the antireflection film positioned under the paste.

3 Claims, 3 Drawing Sheets

(51) Int. Cl.
*H01B 1/22* (2006.01)
*H01L 29/06* (2006.01)
*H01L 31/0236* (2006.01)
*H01L 31/18* (2006.01)

(52) U.S. Cl.
CPC ........ *H01L 31/02363* (2013.01); *H01L 31/18* (2013.01); *Y02E 10/50* (2013.01)

(58) Field of Classification Search
USPC ........................................................ 136/256
See application file for complete search history.

(56) References Cited

U.S. PATENT DOCUMENTS

| | | | | |
|---|---|---|---|---|
| 2008/0220559 | A1* | 9/2008 | Fujii | H01L 31/022425 438/72 |
| 2008/0314444 | A1* | 12/2008 | Kawaguchi | 136/256 |
| 2009/0199897 | A1 | 8/2009 | Naito et al. | |

FOREIGN PATENT DOCUMENTS

| | | | |
|---|---|---|---|
| CN | 101932662 A | | 12/2010 |
| CN | 102081986 A | | 6/2011 |
| JP | 02-293344 | | 12/1990 |
| JP | 04-270140 | | 9/1992 |
| JP | 10-029834 | | 2/1998 |
| JP | 10-29834 A | | 2/1998 |
| JP | 10029834 A | * | 2/1998 |
| JP | 10-326522 | | 12/1998 |
| JP | 11-213754 | | 8/1999 |
| JP | 2001-093326 | | 4/2001 |
| JP | 2009-096662 A | | 5/2009 |
| JP | 2009-209032 | | 9/2009 |
| JP | 2010-184852 | | 8/2010 |
| JP | 2011-512426 A | | 4/2011 |
| JP | 2011-096747 | | 5/2011 |
| JP | 2011-096748 | | 5/2011 |
| TW | 200941740 A | | 10/2009 |
| WO | WO 92/00924 A | | 1/1992 |
| WO | WO 92/00925 A | | 1/1992 |
| WO | WO 9200925 A | * | 1/1992 |
| WO | WO 2009/097264 | | 8/2009 |
| WO | WO 2009/097266 A1 | | 8/2009 |

OTHER PUBLICATIONS

International Search Report of PCT/JP2011/072841 (2 pgs.).
Taiwanese Patent Office's Notification dated Jun. 9, 2015.
Third Party's Observations.
English Language Concise Explanation of Relevance.
Search Report attached to corresponding Taiwan Office Action dated Oct. 21, 2015, including English-language Concise Explanation of Relevance (9 pages).
Search Report attached to Chinese Patent Office's Notification of Jul. 10, 2015, with partial English translation (11 pages).

* cited by examiner (a)

(b-1)

(b-2)

20

SOLAR CELL ELEMENT AND METHOD FOR MANUFACTURING SAME

TECHNICAL FIELD

The present invention relates to a solar cell element and a method for manufacturing the same.

BACKGROUND ART

A solar cell element generally has a silicon-based, for example, p-type semiconductor substrate, an n-type diffusion layer, an antireflection film, aback surface electrode, and a front surface electrode. A conductive paste obtained by mixing conductive particles comprising silver as a main component with glass frit, an organic vehicle, a solvent, etc. is used when forming the front surface electrode. This conductive paste is formed into an electrode pattern by screen printing, stencil printing or the like, and then fired to form the front surface electrode.

In this firing process, normally the action of the glass frit contained in the conductive paste dissolves/eliminates the antireflection film. This establishes electrical contact between the front surface electrode and the diffusion layer. This step is generally referred to as "fire-through."

In order for this fire-through process to be executed favorably, it is preferred that glass having good solubility with the antireflection film be used as the glass frit of the conductive paste. So far, glass containing lead oxide often has been used due to its excellent adherence to a semiconductor substrate and because it is easy to adjust its softening point and the fire-through process can be executed relatively favorably (see Patent Document 1, for example).

However, in the conventional glass containing lead oxide, fire-through is sometimes difficult to control, including cases of insufficient fire-through which causes a failure to achieve ohmic contact, or, excessive fire-through such that part of the front surface electrode intrudes deeply into the semiconductor substrate.

Although the use of glass that does not contain lead oxide was studied, it was still difficult to control the fire-through process, such as not being able to accomplish sufficient fire-through to obtain ohmic contact.

CITATION LIST

Patent Literature

Patent Document 1: Japanese Patent Publication No. 2001-93326 A

SUMMARY OF INVENTION

Technical Problem

An object of the present invention is to provide a solar cell element in which favorable ohmic contact can be realized between a semiconductor substrate and a front surface electrode and in which fire-through can be controlled optimally, and a method for manufacturing such a solar cell element.

Solution to Problem

In order to achieve the object described above, a solar cell element according to one aspect of the present invention comprises:

a semiconductor substrate;

an antireflection film disposed in a first region on one main surface of the semiconductor substrate; and a front surface electrode which is disposed in a second region on the one main surface of the semiconductor substrate, comprises silver as a main component and contains a tellurium-based glass containing tellurium, tungsten, and bismuth as essential components.

A method for manufacturing the solar cell element according to one aspect of the present invention is a method for manufacturing a solar cell element which comprises a semiconductor substrate, an antireflection film disposed in a first region on one main surface of the semiconductor substrate, and a front surface electrode disposed in a second region on the one main surface of the semiconductor substrate, the method comprising:

a first step of forming the antireflection film on the one main surface of the semiconductor substrate;

a second step of printing on the antireflection film a conductive paste containing a conductive powder comprising silver as a main component, a tellurium-based glass frit containing tellurium, tungsten, and bismuth as essential components, and an organic vehicle; and a third step of disposing the antireflection film in the first region of the semiconductor substrate and forming the front surface electrode in the second region of the semiconductor substrate, by firing the conductive paste and eliminating the antireflection film positioned under the conductive paste.

Advantageous Effects of Invention

According to the solar cell element and the method for manufacturing the same, optimal fire-through (firing-through) property can be secured by firing the conductive paste and excellent ohmic contact can be realized between the semiconductor substrate and the front surface electrode.

DESCRIPTION OF EMBODIMENTS

Examples of a solar cell element according to the present invention and a method for manufacturing the same are described hereinafter with reference to the drawings.

Solar Cell Element

First, a basic configuration of the solar cell element according to the present embodiment is described.

Figure 1:
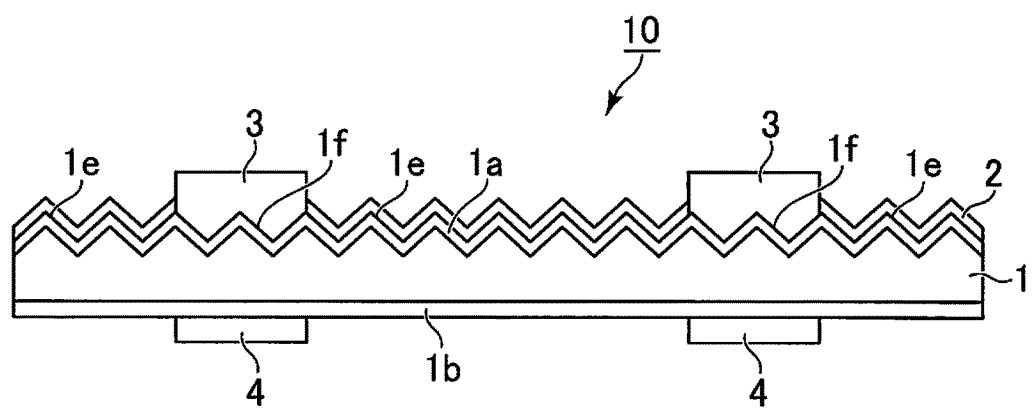
FIG. 1 is a cross-sectional diagram schematically showing an embodiment of a solar cell element according to one aspect of the present invention.

As shown in FIG. 1, a solar cell element 10 of the present embodiment has a semiconductor substrate 1 that has a first semiconductor region of one conductivity-type and a second semiconductor region of an opposite conductivity type (an opposite conductivity type layer 1a) opposite to that of the first semiconductor region, and an antireflection film 2 that is disposed in a first region 1e on a first surface (on the opposite conductivity type layer 1a, in the present embodiment), which is a main surface of the semiconductor substrate 1 where light enters.

The solar cell element 10 further has a first electrode 3, which is a front surface electrode provided in a second region 1f on the first surface of the semiconductor substrate 1, and a second electrode 4, which is a back surface electrode provided on a second surface of the semiconductor substrate 1, which is a main surface on the side opposite to the first surface of the semiconductor substrate 1.

A crystalline silicon substrate such as a monocrystalline silicon substrate or a multicrystalline silicon substrate that has a predetermined dopant element (an impurity for conductivity type control) and exhibits one conductivity type (e.g., p-type) is used as the semiconductor substrate 1. The thickness of the semiconductor substrate 1 is preferably, for example, equal to or less than 250 µm, and more preferably equal to or less than 150 µm. In the present embodiment, a case where a crystalline silicon substrate exhibiting a conductivity type of p-type is used as the semiconductor substrate 1 is described by way of example. In order for the semiconductor substrate 1 made of a crystalline silicon substrate to exhibit the p-type, it is preferred that boron or gallium, for example, be used as the dopant element.

A great number of microscopic projections 1c are formed on the first surface side of the semiconductor substrate 1. These microscopic projections 1c are provided in order to cause multiple reflection of light emitted onto the front surface side of the semiconductor substrate 1 and reduce the reflection of the light from the surface. These microscopic projections 1c are in the shape of a cone or a pyramid, the size of which can be changed by controlling a gas concentration or etching time in an RIE (Reactive Ion Etching) method.

The opposite conductivity type layer 1a is a layer that exhibits a conductivity type opposite to that of the semiconductor substrate 1 and is formed within a surface layer of, for example, the first surface of the semiconductor substrate 1. When a silicon substrate exhibiting a conductivity type of p-type is used as the semiconductor substrate 1, the opposite conductivity type layer 1a is formed to exhibit a conductivity type of n-type. The opposite conductivity type layer 1a can be formed by, for example, diffusing impurities such as phosphorus in the first surface of the silicon substrate.

The antireflection film 2 serves to reduce the reflectance of light having a desired wavelength range and increase the amount of photogenerated carriers and is capable of improving a photocurrent density Jsc of the solar cell element 10. The antireflection film 2 is configured by, for example, a SiNx film, $TiO_2$ film, $SiO_2$ film, MgO film, ITO film, $SnO_2$ film, ZnO film, or the like. The thickness of the antireflection film 2 is set appropriately depending on the constituting material so as to be able to realize non-reflective conditions with respect to appropriate incident light.

Furthermore, a BSF (Back Surface Field) region 1b exhibiting a conductivity type of p+ is formed in a surface layer part on the second surface side of the semiconductor substrate 1 of the solar cell element 10, as shown in FIG. 1. The BSF region 1b serves to suppress the efficiency reduction caused by recombination of carriers in the vicinity of the second surface of the semiconductor substrate 1 and forms an internal electric field on the second surface side of the semiconductor substrate 1.

The first electrode 3 has first bus bar electrodes and a plurality of linear finger electrodes intersecting with the first bus bar electrodes. The width of the first bus bar electrodes is approximately, for example, 1.3 to 2.5 mm. The finger electrodes are in a linear shape and have a width of approximately 50 to 200 µm, which is narrower than the first bus bar electrodes.

Moreover, the plurality of finger electrodes are provided at intervals of approximately 1.5 to 3 mm therebetween. The thickness of the first electrodes 3 is approximately 10 to 40 µm. The first electrodes 3 described above can be formed by screen printing or the like a conductive paste into a desired shape and thereafter firing. The conductive paste used comprises a conductive powder containing silver as a main component, a tellurium-based glass frit containing tellurium, tungsten, and bismuth as essential components, and an organic vehicle, as described in detail hereinafter.

The second electrode 4 may have the same electrode shape as the first electrodes 3 and can be formed with the same material and method as the first electrode 3 described above. Also, second bus bar electrodes comprising silver may be formed, and a collector electrode comprising aluminum may be formed on substantially the entire surface of the second surface of the semiconductor substrate 1 excluding a part of the second bus bar electrodes.

A texture structure of the solar cell element of the present embodiment and the conductive paste used in electrode formation are described next in detail.

First of all, the texture structure is described.

The solar cell element 10 has a texture structure in which the projections 1c having average width and height of 2 µm or less are formed on the first surface side of the semiconductor substrate 1.

The microscopic projections 1c to be formed have an average width and height of 2 µm or less. An average width and height of the projections 1c greater than 2 µm need an increased etching processing time while there is no appreciable further reduction of the reflectance at the front surface of the semiconductor substrate 1.

The average width and height of the projections 1c are not less than 0.1 µm but not more than 1 µm. This range is preferable in terms of being able to reduce the reflectance at the surface of the semiconductor substrate 1 and to improve the adherence strength to the first electrode 3.

It is preferred that the average width and height of the microscopic projections 1c be not less than 0.1 µm but not more than 1 µm in order to evenly form the microscopic projections 1c over the entire first surface of the semiconductor substrate 1 with accurate controllability.

It is also preferred that the microscopic projections 1c have an aspect ratio (height/width of the projections 1c) of 0.1 to 2 on average. When the aspect ratio is not more than 0.1, the average reflectance of light having a wavelength of, for example, 500 to 1000 nm is approximately 25%, increasing the reflectance at the front surface of the semiconductor substrate 1. However, an aspect ratio of not less than 2 on average breaks the microscopic projections 1c during the manufacturing process and causes more leakage current when the solar cell element 10 is formed. As a result, favorable output characteristics cannot be accomplished.

Next, the conductive paste for forming the first electrode 3, which is the front surface electrode, is described in detail.

The first electrode 3 comprises silver as a main component and contains a tellurium-based glass containing tellurium, tungsten, and bismuth as essential components. The conductive paste for forming the first electrode 3 contains the above-described conductive powder, glass frit, appropriate additive, and organic vehicle. Note that "main component" means a component that is contained in an amount exceeding 50 mass % and preferably a component that is contained in an amount equal to or greater than 70 mass %.

The content of the glass frit in the conductive paste may be an amount normally contained in a conductive paste used for forming a solar cell electrode. For example, it is preferred that the amount of glass frit be 0.1 to 10 parts by mass with respect to 100 parts by mass of conductive particles. When the blending amount of the glass frit is equal to or greater than 0.1 parts by mass with respect to 100 parts by mass of conductive powder, predetermined adhesion and electrode strength can be obtained. On the other hand, when the blending amount of the glass frit is equal to or less than 10 parts by mass with respect to 100 parts by mass of conductive powder, not only is it possible to reduce glass floating on a surface of the electrode, but also the increase in contact resistance caused by the glass flowing into an interface can be alleviated. Although not particularly limited, the glass frit blended in the conductive paste of the present invention preferably has an average particle size of 0.5 to 5.0 μm. The glass frit also preferably has a softening point of 300 to 550° C.

The organic vehicle is not particularly limited, and an organic binder, solvent, etc. commonly used as a vehicle in silver paste can be selected and mixed as appropriate. Examples of organic binders include celluloses, acrylic resins, phenol resins, alkyd resins, rosin esters and the like, while examples of solvents include alcohols, ethers, esters, hydrocarbons and other organic solvents as well as water and mixed solvents of these. The amount of the organic vehicle is not particularly limited, and can be adjusted appropriately according to the application method or the like to an amount suitable for retaining inorganic components such as the conductive powder and the glass frit in the paste, but is normally about 5 to 40 parts by mass per 100 parts by mass of the conductive powder.

The conductive paste used in the present invention essentially contains no lead component, and specifically the lead content of the conductive paste is 1000 ppm or less. If needed, other components such as a plasticizer, viscosity modifier, surfactant, oxidizer, metal oxide, and/or metal organic compound that are normally added as additives can appropriately be blended in the conductive paste to the extent that they do not detract from the effects of the present embodiment. In addition, silver compounds such as silver carbonate, silver oxide, and silver acetate may be blended, or copper oxide, zinc oxide, titanium oxide or the like may appropriately be added for the purpose of improving firing temperature, solar cell characteristics, and the like.

The tellurium-based glass contains, in terms of oxide, 30 to 80 mol % of tellurium, 10 to 50 mol % of tungsten, and 5 to 25 mol % of bismuth. The sum of the tellurium, tungsten, and bismuth is preferably 60 mol % or more and more preferably 80 mol % or more.

In the tellurium-based glass frit, the tellurium forms a glass network as a network-former and glass formation can easily be performed as long as the content of the tellurium in the entire glass frit is 30 to 80 mol % and preferably 40 to 70 mol % in terms of oxide. This range is preferable in terms of improving fire-through characteristics.

The tungsten contributes to expanding the vitrification range of the glass frit and stabilizing the glass frit. Glass formation can easily be performed as long as the content of the tungsten is 10 to 50 mol % and preferably 15 to 35 mol % in terms of oxide. This range is preferable in terms of further improving fire-through characteristics.

The bismuth contributes to expanding the vitrification range of the glass frit and improving the chemical durability of the same. When the bismuth is contained in an amount exceeding 25 mol % in terms of oxide, a crystal phase is likely to form and the stability of the glass will be impaired. It is preferred that the bismuth be contained in an amount of 5 to 25 mol % in view of lessening the problem of bleeding of the glass components.

Although not required, the glass frit described above may further contain one or more of alkali metals such as lithium and sodium, alkaline-earth metals such as magnesium, calcium, strontium, and barium, and elements such as molybdenum, zinc, aluminum, dysprosium, yttrium, niobium, lanthanum, silver, zirconium, titanium, boron, germanium, phosphorus, and tantalum. The sum of the contents of these elements is within the range of less than 40 mol % and preferably less than 20 mold.

Manufacturing Method

A summary of the method for manufacturing the solar cell element of the present embodiment is now described.

First, a method for preparing the semiconductor substrate 1 is described. When the semiconductor substrate 1 is a monocrystalline silicon substrate, the semiconductor substrate 1 is formed by, for example, a pulling method or the like. When the semiconductor substrate 1 is a multicrystalline silicon substrate, the semiconductor substrate 1 is formed by, for example, a casting method or the like. Hereinafter, an example in which p-type multicrystalline silicon is used is described.

Figure 2:
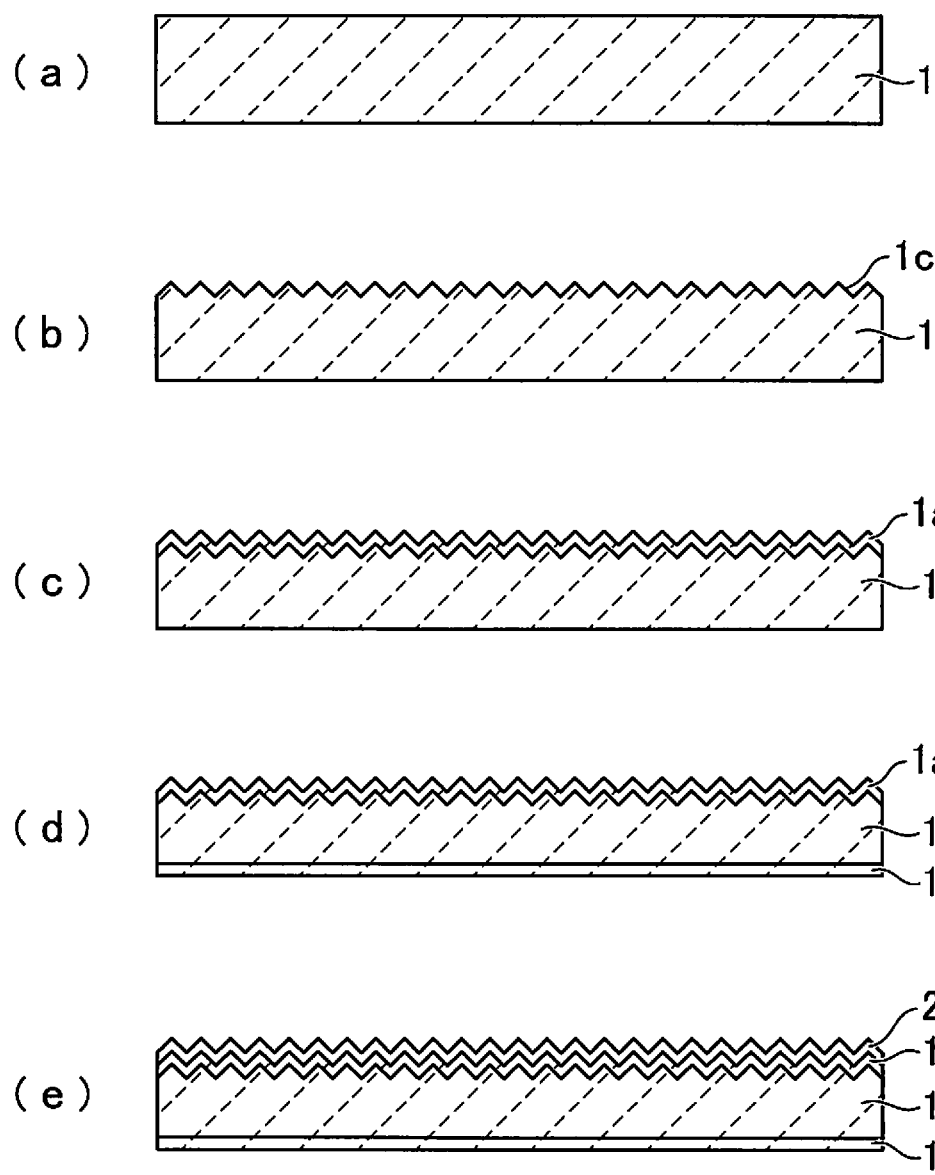
FIGS. 2(a) to 2(e) are cross-sectional diagrams each schematically showing a step of manufacturing the solar cell element according to the aspect of the present invention.

First, a multicrystalline silicon ingot is prepared by, for example, a casting method. Next, this ingot is sliced into a thickness of, for example, 250 μm or less. Subsequently, the surface is preferably very slightly etched with an aqueous solution of, for example, NaOH or KOH or hydrofluoric acid or fluonitric acid in order to remove mechanically damaged layers of the cut section or to clean contaminated layers of the semiconductor substrate 1 (see FIG. 2(*a*)).

Next, a great number of microscopic projections 1*c* are formed on the first surface side of the semiconductor substrate 1. These microscopic projections 1*c* can be formed using an RIE method. For instance, first, the semiconductor substrate 1 is installed on an upper part of an RF electrode of an RIE device, and then the inside of a chamber grounded by an earth is vacuum-drawn sufficiently using a vacuum pump. Thereafter, a predetermined flow rate of etching gas is introduced into the inside of the chamber by means of a mass flow controller, and the pressure inside the chamber is adjusted to a predetermined pressure by a pressure regulator. Thereafter, a plasma state is generated to excite and decompose the etching gas by applying RF power from an RF power supply to the RF electrode. Consequently, the surface of the semiconductor substrate 1 is etched by the generated ions and radicals. Etching the surface of the semiconductor substrate 1 basically separate the constituents of the surface. However, some of the constituents cannot be separated and remain in the surface of the semiconductor substrate 1, while some of the separated substances adhere to the surface of the semiconductor substrate 1 again and become etching residues. The etching residues that primarily contain the materials etched from the semiconductor substrate 1 are intentionally deposited onto the surface of the semiconductor substrate 1 again and used as an etching mask, resulting in realization of roughening the surface of the semiconductor substrate 1 for forming a concave-convex structure on the surface (see FIG. 2(*b*)).

Next, the n-type opposite conductivity type layer 1*a* is formed in the surface layer of the first surface of the semiconductor substrate 1. The opposite conductivity type layer 1*a* is formed by an application and thermal diffusion method for applying $P_2O_5$ in a paste form to the surface of the semiconductor substrate 1 and then thermally diffusing the same, a gaseous phase thermal diffusion method for using POCl$_3$ (phosphorus oxychloride) in a gas form as a diffusion source, an ion implantation method for diffusing phosphorus ions directly to the surface, and the like. The opposite conductivity type layer 1a is formed to have a depth of approximately 0.2 to 2.0 µm and a sheet resistance of approximately 60 to 150Ω/☐ (see FIG. 2(c)).

Next, the BSF region 1b is formed on the second surface of the semiconductor substrate 1, the BSF region 1b having a semiconductor impurity of one conductivity type diffused at a high concentration. For instance, there can be used a method for forming the BSF region 1b at a temperature of 800 to 1100° C. by means of a thermal diffusion method using BBr$_3$ (boron tribromide) as a diffusion source, and a method for applying an Al (aluminum) paste comprising Al powder, an organic vehicle and the like by means of a printing method and thereafter thermally treating (firing) the Al paste at approximately 600 to 850° C. to diffuse Al on the semiconductor substrate 1. The method for printing and firing the Al paste can not only form a desired diffusion region only on a printed surface, but also eliminate the need to remove the n-type opposite conductivity type layer that is formed on the second surface at the same time when the opposite conductivity type layer 1a is formed. Thus, it is only necessary to perform pn isolation only on the peripheries of the second surface side by using a laser or the like. Furthermore, the aluminum resulted from the firing process may not be removed but used as a collector electrode (see FIG. 2(d)).

Subsequently, the antireflection film 2 is formed. The antireflection film 2 is formed by, for example, a PECVD (plasma enhanced chemical vapor deposition) method, a vapor deposition method, a sputtering method, or the like. For instance, when using the PECVD method to form the antireflection film 2 configured by an SiNx film, the antireflection film 2 is formed by diluting a mixed gas of SiH$_4$ (silane) and NH$_3$ (ammonia) with N$_2$ (nitrogen), with the temperature inside a reaction chamber at approximately 500° C., and then forming the mixed gas into a plasma with glow discharge decomposition and depositing the same (see FIG. 2(e)).

Next, the first electrode 3 and the second electrode 4 are formed as follows.

The first electrode 3 is prepared using an Ag (silver) paste that contains metal powder containing Ag and the like, an organic vehicle, and a glass frit, the Ag paste being described hereinafter in detail. This Ag paste is applied onto the first surface of the semiconductor substrate 1 and thereafter fired for approximately several tens of seconds to several tens of minutes at a peak temperature of 600 to 850° C., and the fired substance breaks through the antireflection layer 2 by fire-through, bringing the opposite conductivity-type layer 1a and the first electrode 3 into electrical contact with each other. A screen printing method or the like can be used as a method for applying the Ag paste. Preferably, after the application of the Ag paste, the solvent is driven off at a predetermined temperature to dry the paste.

Subsequently, the second electrode 4 is prepared using, for example, an Ag paste that contains metal powder comprising Ag and the like, an organic vehicle, and a glass frit. This Ag paste is applied into a predetermined shape. A screen printing method or the like can be used as a method for applying the Ag paste. Preferably, after the application of the Ag paste, the solvent is driven off at a predetermined temperature to dry the paste. Then, the semiconductor substrate 1 is fired in a firing furnace for approximately several tens of seconds to several tens of minutes at a peak temperature of 600 to 850° C. In this manner, the second electrode 4 is formed on the second surface of the semiconductor substrate 1.

The solar cell element 10 can be prepared in a manner described above.

Next, the manufacturing step, the key part of the present embodiment, is described in detail.

The manufacturing step, the key part of the present embodiment, includes a first step of forming the antireflection film 2 on one main surface of the semiconductor substrate 1, a second step of printing a conductive paste onto the antireflection film 2, the conductive paste containing a conductive powder comprising silver as a main component, a tellurium-based glass frit containing tellurium, tungsten, and bismuth as essential components, and an organic vehicle, and a third step of forming the first electrode 3, which is a front surface electrode, in the second region 1f on the one main surface of the semiconductor substrate 1, by firing the conductive paste and eliminating the antireflection film positioned under the conductive paste.

However, a fourth step may be executed prior to the first step, the fourth step being a step of forming the textured structure in which the projections having an average width and height of 2 µm or less are formed on the one main surface side of the semiconductor substrate 1. It is more preferred that the average width and height of the projections be not less than 0.1 µm but not more than 1 µm.

The fourth step is described hereinafter.

Chlorine gas, fluorine gas, and oxygen gas are used as the etching gas. The reaction pressure is set at approximately 5 to 15 Pa and the RF power for generating a plasma is set at approximately 5 to 10 kW, while these gases are caused to flow at a predetermined flow rate. Consequently, the surfaces of the semiconductor substrate 1 can be roughened. For instance, etching may be performed for approximately 5 minutes with a 7 Pa reaction pressure and 5 kW RF power for generating a plasma, while introducing Cl$_2$ (chlorine) gas, O$_2$ (oxygen) gas, and CHF$_3$ (trifluoromethane) gas at a flow ratio of 1:6:4 into a chamber. However, the types of gases are not limited to Cl$_2$ and CHF$_3$; thus, for example, HCl and ClF$_3$ as the chlorine gases, and F$_2$, NF$_3$, CF$_4$, C$_2$F$_6$, C$_3$F$_8$, ClF$_3$, SF$_6$ and other gases as the fluorine gasses, may appropriately be combined and used.

Next, the antireflection film 2 is formed on the one main surface of the semiconductor substrate 1 on which the opposite conductivity type layer 1a is formed (the first step).

Subsequently, the conductive paste is printed onto the antireflection film 2 (the second step). The conductive paste used in this step contains a conductive powder comprising silver as a main component, a tellurium-based glass frit containing tellurium, tungsten, and bismuth as essential components, and an organic vehicle.

The conductive powder is not particularly limited, except that it contains silver as a main component. Conventional powder in spherical, flaky, or dendritic shape is used as the conductive powder. Not only pure silver powder but also silver coated composite powder, at least the surfaces of which are configured as silver layers, an alloy having silver as a main component, and the like may be used. The silver powder preferably has an average particle size of 0.1 to 10 µm. Furthermore, two or more types of silver powders of different average particle sizes, particle distributions, shapes, and the like may be combined and used. In addition, silver powder and conductive powders other than silver powder may be combined and used.

The conductive paste used in the present embodiment is formed into a paste, paint, or ink with a suitable rheology for a screen printing method or other printing methods by mixing the abovementioned conductive powder, glass frit and appropriate additive with an organic vehicle.

In the tellurium-based glass frit used in the present embodiment, tellurium contained in the entire glass frit is 30 to 80 mol %, and preferably 40 to 70 mol % in terms of oxide.

The content of the tungsten contained in the entire glass frit is 10 to 50 mol %, and preferably 15 to 35 mol %, in terms of oxide.

The content of the bismuth contained in the entire glass frit is 5 to 25 mol % in terms of oxide.

Additionally, alkali metals such as lithium and sodium, alkaline-earth metals such as magnesium, calcium, strontium, and barium, and elements such as molybdenum, zinc, aluminum, dysprosium, yttrium, niobium, lanthanum, silver, zirconium, titanium, boron, germanium, phosphorus, and tantalum are contained in a total amount of less than 20 mol %.

The conductive paste with the abovementioned blended components is printed onto the antireflection film 2 (the second step). As a result of firing the printed conductive paste and eliminating the antireflection film positioned under the conductive paste, the antireflection film 2 is disposed in the first region 1e on the one main surface of the semiconductor substrate 1, and the first electrode 3, which is the front surface electrode, is disposed in the second region 1f on the one main surface of the semiconductor substrate 1.

Examples

Examples that further embody the present embodiment are described hereinafter; however, the present embodiment is not limited thereto.

A 15.6 cm×15.6 cm silicon substrate that is 200 µm in thickness, has a specific resistance of 1.5 Ω·cm, and consists of multicrystalline silicon was immersed in a NaOH solution, and each surface of the substrate was etched by 10 µm. Subsequently, microscopic projections having an average width and height of 1 µm were formed on a front surface of the silicon substrate by means of the RIE method with a reaction pressure of 7 Pa and an RF power of 5 kW for generating a plasma, while introducing $Cl_2$ gas, $O_2$ gas, and $CHF_3$ gas to a chamber at a flow ratio of 1:6:4, thereby obtaining the textured structure.

Then, P (phosphorus) was diffused so that the sheet resistance of the front surface part of the silicon substrate would become 80Ω/□.

Next, an Al paste was screen-printed onto a back surface of the silicon substrate, which was then fired at 750° C. The sheet resistance of the back surface of the silicon substrate was 15Ω/□.

Subsequently, an SiNx film having a refractive index of 2.1 and a film thickness of 80 Å was formed on the front surface side of the silicon substrate by means of a plasma CVD method, to obtain an antireflection film.

On the other hand, 100 parts by mass of silver powder, which has an average particle diameter (D50) of 1.8 µm based on a laser diffraction scattering particle size distribution measurement, and 2 parts by mass of the glass frit having a composition shown in Table 1, were dispersed in an organic vehicle consisting of 1.6 parts by mass of ethyl cellulose and 6.4 parts by mass of butyl carbitol, to prepare each conductive paste (Samples No. 1 to 33).

Note that each of the components in the glass composition shown in Table 1 is expressed in mol % in terms of oxide, and the samples with an asterisk * marked in front of the sample numbers indicate significant "bleeding phenomenon," which is described hereinbelow.

Each of the samples was printed on a front surface of the antireflection film of the silicon substrate and then fired at a peak temperature of 800° C., to form 100 µm-wide finger electrodes with a 1.6 mm pitch and two 2 mm-wide bus bar electrodes. Accordingly, a solar cell element was obtained.

Figure 3:
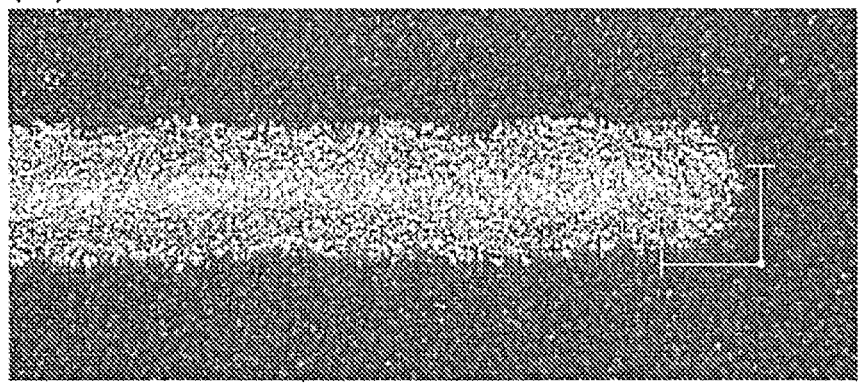
FIG. 3(a) is a photographic illustration of a state of no "bleeding phenomenon" where a glass component bleeds from an outer rim of an electrode shape, FIG. 3(b-1) is a photographic illustration of a state with "bleeding phenomenon," and FIG. 3(b-2) is a photographic illustration with a dashed line indicating "bleeding" of FIG. 3(b-1).
Figure 3:
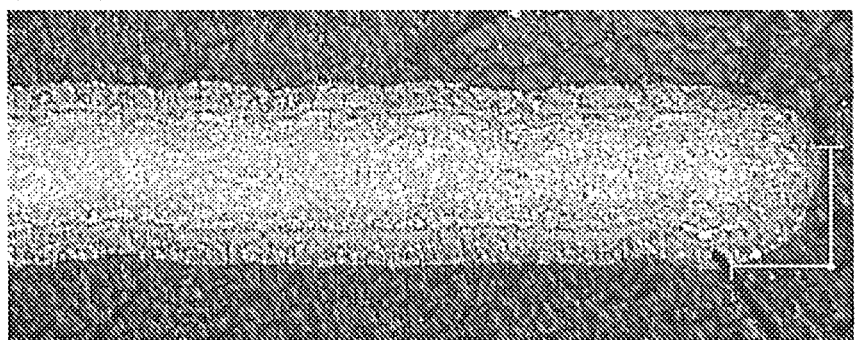
Figure 3:
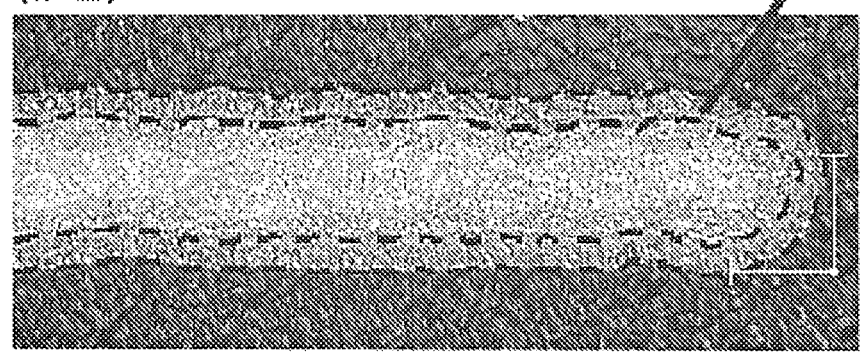

In each of the samples, the presence/absence of "bleeding phenomenon" at an outer rim of the electrode shape of each finger electrode was observed through an optical microscope, as shown in FIGS. 3(a), 3(b-1), and 3(b-2). FIG. 3(a) is an example in which the electrode without "bleeding" was observed through the optical microscope. FIG. 3(b-1) is an example of the electrode in which "bleeding" occurred. FIG. 3(b-2) is a diagram in which the "bleeding" shown in FIG. 3(b-1) is indicated by a dashed line.

Table 1 also shows the observations of "bleeding." The meanings of the symbols shown in the "bleeding" column of the table are as follows.

⊗: No "bleeding" throughout a 100 µm-wide line

◯: "Bleeding" of 10 µm or less was present on one side of the 100 µm-wide line

Δ: "Bleeding" of 20 µm or less was present on one side of the 100 µm-wide line x: "Bleeding" over 20 µM was present on one side of the 100 µm-wide line

TABLE 1

| Sample No. | Glass Composition | | | | | | | | | | | | | | | Bleeding |
|---|---|---|---|---|---|---|---|---|---|---|---|---|---|---|---|---|
| | Te | W | Mo | Bi | Zn | B | Zr | La | Dy | Y | Nb | Ba | Ca | Na | | |
| 1 | 50.0 | 25.0 | | 25.0 | | | | | | | | | | | | ◯ |
| 2 | 50.0 | 40.0 | | 10.0 | | | | | | | | | | | | ⊗ |
| 3 | 60.0 | 30.0 | | 10.0 | | | | | | | | | | | | ◯ |
| 4 | 68.3 | 19.5 | | 9.8 | | 2.4 | | | | | | | | | | ◯ |
| 5 | 66.7 | 19.0 | | 9.5 | | 2.4 | 2.4 | | | | | | | | | ◯ |
| 6 | 70.0 | 25.0 | | 5.0 | | | | | | | | | | | | ⊗ |
| *7 | 48.8 | 24.4 | | | 24.4 | 2.4 | | | | | | | | | | X |
| *8 | 50.0 | 25.0 | | | 25.0 | | | | | | | | | | | X |
| *9 | 46.4 | 23.3 | | | 23.3 | 2.3 | 4.7 | | | | | | | | | X |
| *10 | 46.2 | 23.0 | | 0.9 | 23.0 | 2.3 | 4.6 | | | | | | | | | Δ |
| *11 | 44.5 | 22.3 | | 4.4 | 22.2 | 2.2 | 4.4 | | | | | | | | | Δ |
| *12 | 47.2 | 23.6 | | | 23.6 | 4.7 | 0.9 | | | | | | | | | X |
| *13 | 46.4 | 23.1 | | | 23.1 | 4.6 | 2.8 | | | | | | | | | X |
| *14 | 45.6 | 22.7 | | | 22.7 | 4.5 | 4.5 | | | | | | | | | X |
| *15 | 66.7 | 9.5 | | | 19.0 | 4.8 | | | | | | | | | | X |

TABLE 1-continued

| Sample No. | Te | W | Mo | Bi | Zn | B | Zr | La | Dy | Y | Nb | Ba | Ca | Na | Bleeding |
|---|---|---|---|---|---|---|---|---|---|---|---|---|---|---|---|
| *16 | 70.0 | 20.0 | | | 10.0 | | | | | | | | | | X |
| *17 | 80.0 | 10.0 | | | 10.0 | | | | | | | | | | X |
| *18 | 60.0 | 30.0 | | | | | 10.0 | | | | | | | | X |
| *19 | 70.0 | 20.0 | | | | | 10.0 | | | | | | | | X |
| *20 | 60.0 | 30.0 | | | | | | 10.0 | | | | | | | X |
| *21 | 70.0 | 20.0 | | | | | | 10.0 | | | | | | | Δ |
| *22 | 60.0 | 30.0 | | | | | | | 10.0 | | | | | | Δ |
| *23 | 70.0 | 20.0 | | | | | | | 10.0 | | | | | | X |
| *24 | 50.0 | 25.0 | | | | | | | | | 25.0 | | | | X |
| *25 | 50.0 | 25.0 | | | | | | | | | | 25.0 | | | X |
| *26 | 50.0 | 25.0 | | | | | | | | | | | 25.0 | | X |
| *27 | 50.0 | 25.0 | | | | | | | | | | | | 25.0 | X |
| *28 | 50.0 | | | | 25.0 | | | | 25.0 | | | | | | Δ |
| *29 | 70.0 | | 20.0 | 10.0 | | | | | | | | | | | Δ |
| *30 | 65.1 | | 18.6 | 9.3 | | 2.3 | 4.7 | | | | | | | | Δ |
| *31 | 70.0 | 20.0 | | 10.0 | | | | | | | | | | | X |
| *32 | 70.0 | 20.0 | | | | | | 10.0 | | | | | | | Δ |
| *33 | 70.0 | 20.0 | | | | | | | | | 10.0 | | | | Δ |

As is clear from Table 1, when the front surface electrode is formed using the conductive paste that includes glass containing tellurium, tungsten, and bismuth as essential components, the "bleeding phenomenon" can be prevented effectively.

In each of the conductive pastes of the present examples, even when the surface electrode breaks through the antireflection film (SiNx) to intrude into the silicon substrate at the time of the fire-through process, intrusion of the surface electrode can be stopped at a relatively shallow area. However, in this case there is concern that ohmic contact cannot be accomplished. The quality of ohmic contact can be determined by evaluating the contact resistance between the electrode and the substrate. In each of samples 1 to 6, the value of the contact resistance was measured and evaluated using a TLM (transmission line model) method from resistance values between the finger electrodes measured with a digital multimeter (3458A MULTIMETER, produced by HEWLETT PACKARD).

The results are shown in Table 2. Note that the meanings of the symbols shown in the "contact resistance" column of the table are as follows.

⊗: Less than 0.05 Ωcm²
○: Equal to or greater than 0.05 Ωcm², less than 0.08 Ωcm²
Δ: Equal to or greater than 0.08 Ωcm², less than 0.10 Ωcm²
x: Equal to or greater than 0.10 Ωcm²

TABLE 2

| Sample No. | Te | W | Bi | B | Zr | Contact Resistance |
|---|---|---|---|---|---|---|
| 1 | 50.0 | 25.0 | 25.0 | | | ○ |
| 2 | 50.0 | 40.0 | 10.0 | | | Δ |
| 3 | 60.0 | 30.0 | 10.0 | | | ⊗ |
| 4 | 68.3 | 19.5 | 9.8 | 2.4 | | ⊗ |
| 5 | 66.7 | 19.0 | 9.5 | 2.4 | 2.4 | ○ |
| 6 | 70.0 | 25.0 | 5.0 | | | Δ |

REFERENCE SIGNS LIST

1 . . . Semiconductor substrate (silicon substrate)
1a . . . Opposite conductivity type layer
1b . . . BSF region
1c . . . Microscopic projections
2 . . . Antireflection film
3 . . . First electrode (front surface electrode)
4 . . . Second electrode (back surface electrode)
10 . . . Solar cell element
20 . . . Bleeding

The invention claimed is:

1. A solar cell element, comprising:
a semiconductor substrate with a main surface having a texture structure in which projections having an average width and height of 2 μm or less are formed;
an antireflection film disposed in a first region on the main surface of the semiconductor substrate; and
a front surface electrode which is disposed in a second region on the main surface of the semiconductor substrate, comprises silver as a main component and contains a tellurium-based glass containing tellurium, tungsten, and bismuth as essential components, wherein the tellurium-based glass does not contain copper and comprises, in terms of oxide, tellurium in an amount of 50.0 to 70.0 mol %, tungsten in an amount of 19.0 to 40.0 mol %, and bismuth in an amount of 5.0 to 25.0 mol %, the sum of the tellurium, tungsten and bismuth, in terms of oxide, being at least 80 mol %, wherein
the semiconductor substrate is a multicrystalline silicon semiconductor substrate,
the front surface electrode has a plurality of finger electrodes, and
the finger electrodes essentially have no bleeding of the glass component from an outer rim thereof.

2. The solar cell element according to claim 1, wherein the average width and average height of the projections are not less than 0.1 μm but not more than 1 μm.

3. The solar cell element according to claim 2, wherein the projections have an average aspect ratio of 0.1 to 2.

* * * * *